United States Patent
Gupta et al.

(10) Patent No.: US 10,813,248 B2
(45) Date of Patent: Oct. 20, 2020

(54) ELECTRONIC COOLING FAN WITH AIRFLOW RECIRCULATION PREVENTION DURING FAN FAILURE

(71) Applicant: CISCO TECHNOLOGY, INC., San Jose, CA (US)

(72) Inventors: Rohit Dev Gupta, Bangalore (IN); Robert Gregory Twiss, Chapel Hill, NC (US)

(73) Assignee: Cisco Technology, Inc., San Jose, CA (US)

( * ) Notice: Subject to any disclaimer, the term of this patent is extended or adjusted under 35 U.S.C. 154(b) by 3 days.

(21) Appl. No.: 16/184,550

(22) Filed: Nov. 8, 2018

(65) Prior Publication Data
US 2020/0154600 A1    May 14, 2020

(51) Int. Cl.
*H05K 7/20*    (2006.01)

(52) U.S. Cl.
CPC ....... *H05K 7/20209* (2013.01); *H05K 7/2019* (2013.01); *H05K 7/20736* (2013.01)

(58) Field of Classification Search
CPC ............. H05K 7/20209; H05K 7/2019; H05K 7/20736
See application file for complete search history.

(56) References Cited

U.S. PATENT DOCUMENTS

| | | | |
|---|---|---|---|
| 6,011,689 A * | 1/2000 | Wrycraft | G06F 1/20 361/679.31 |
| 6,031,717 A * | 2/2000 | Baddour | G06F 1/20 361/679.48 |
| 6,767,186 B2 * | 7/2004 | Olesiewicz | F04D 29/364 416/136 |
| 7,184,268 B2 | 2/2007 | Espinoza-Ibarra et al. | |
| 7,425,117 B2 * | 9/2008 | Robinson | F04D 29/382 415/141 |
| 8,801,374 B1 * | 8/2014 | Lima | F04D 29/601 415/208.2 |
| 9,482,349 B2 * | 11/2016 | Anderl | F16K 31/086 |
| 9,523,432 B2 | 12/2016 | Anderl et al. | |
| 9,938,990 B2 * | 4/2018 | Amin-Shahidi | F04D 29/646 |
| 10,151,324 B2 * | 12/2018 | Amin-Shahidi | F04D 29/522 |
| 2004/0141288 A1 * | 7/2004 | Franz | F04D 29/366 361/695 |
| 2005/0241810 A1 * | 11/2005 | Malone | H05K 7/20727 165/122 |
| 2006/0152901 A1 * | 7/2006 | Espinoza-Ibarra | F04D 29/382 361/695 |
| 2007/0207723 A1 * | 9/2007 | Baker | F04D 25/14 454/229 |

(Continued)

*Primary Examiner* — Binh B Tran
*Assistant Examiner* — Michael A Matey
(74) *Attorney, Agent, or Firm* — Cindy Kaplan

(57) ABSTRACT

In one embodiment, an apparatus includes a fan for cooling electronics within a chassis, the fan comprising a rotor with a plurality of fan blades connected thereto for generating an axial airflow during operation of the fan, a sensor for detecting failure of the fan, and an airflow blocking device positioned at an exhaust side of the fan and configured to prevent airflow through the fan upon detection of the fan failure, wherein the airflow blocking device is stowed in a position removed from a path of the axial airflow generated by the fan during operation of the fan. A method for preventing airflow recirculation at a failed fan is also disclosed herein.

17 Claims, 10 Drawing Sheets

(56) References Cited

U.S. PATENT DOCUMENTS

| | | | | |
|---|---|---|---|---|
| 2013/0109290 A1* | 5/2013 | Jones | ............... | G06F 1/206 |
| | | | | 454/184 |
| 2015/0300368 A1* | 10/2015 | Hsu | ............... | F04D 17/16 |
| | | | | 415/108 |
| 2016/0146212 A1* | 5/2016 | Cananzi | ............... | F04D 27/00 |
| | | | | 417/44.11 |
| 2016/0215779 A1* | 7/2016 | Anderl | ............... | F04D 19/024 |
| 2017/0130736 A1* | 5/2017 | Cruz | ............... | F04D 29/524 |
| 2017/0221526 A1* | 8/2017 | Albrecht | ............... | G06F 1/182 |
| 2017/0339803 A1* | 11/2017 | Kaun | ............... | H05K 7/20172 |
| 2018/0235102 A1* | 8/2018 | Anderl | ............... | H05K 7/20172 |
| 2018/0376614 A1* | 12/2018 | Xiong | ............... | H05K 7/20145 |
| 2019/0239384 A1* | 8/2019 | North | ............... | F04D 29/703 |

\* cited by examiner

ELECTRONIC COOLING FAN WITH AIRFLOW RECIRCULATION PREVENTION DURING FAN FAILURE

TECHNICAL FIELD

The present disclosure relates generally to cooling fans for electronics, and more particularly, preventing airflow recirculation through the fan during fan failure.

BACKGROUND

Electronic systems such as network devices are typically enclosed within a chassis or other enclosure. Electronic components such as high power equipment using high speed optical transceivers generate a significant amount of heat and require cooling, which is typically provided by cooling fans located within the chassis. For any fan cooled electronic equipment, appropriate design consideration should be made for fan failure conditions since equipment cooled with multiple fans is expected to operate with a single fan failure without any degradation in its performance.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
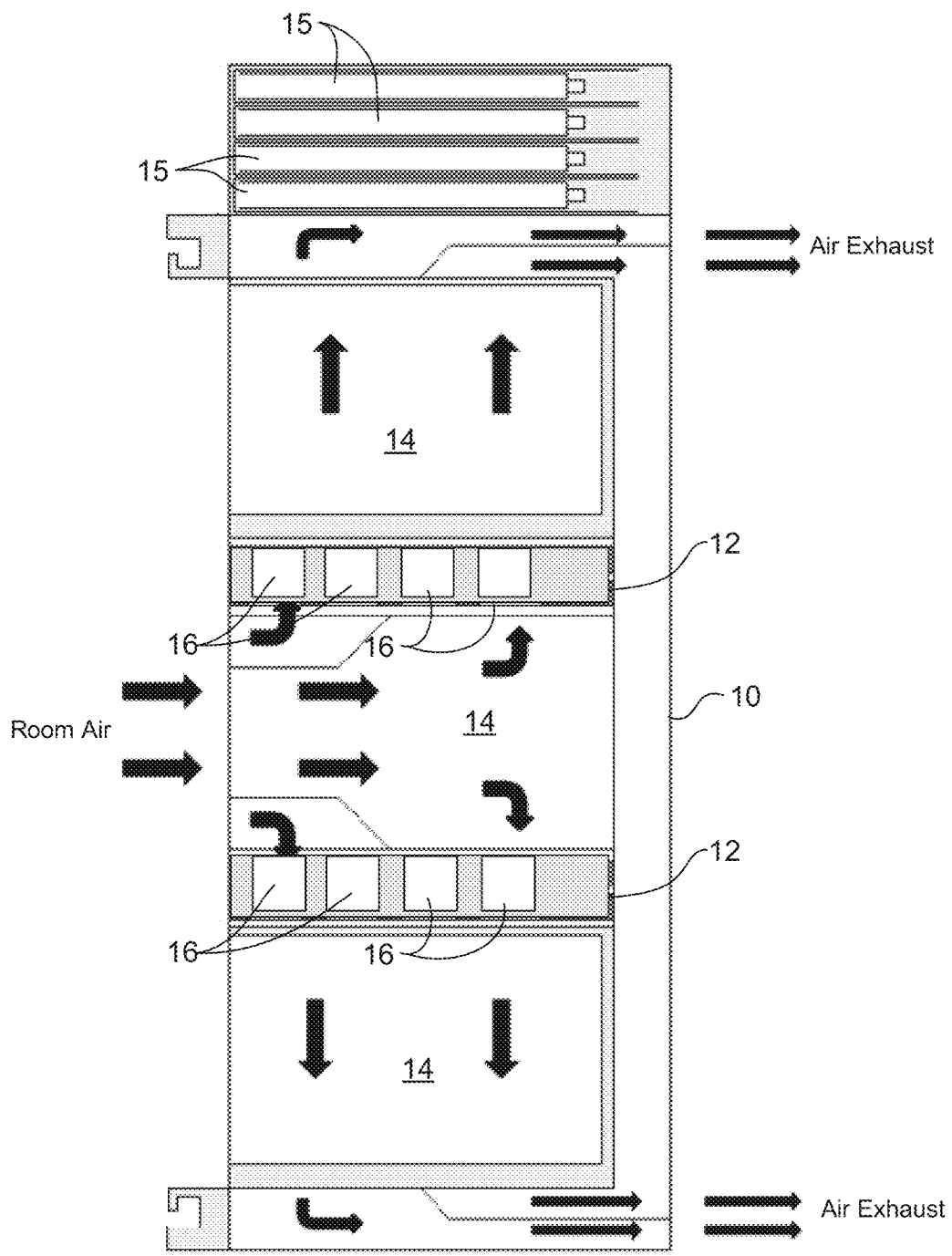
FIG. 1A is a plan view of a chassis comprising fan trays for cooling electronic equipment within the chassis.

In one embodiment, an apparatus generally comprises a fan for cooling electronics within a chassis, the fan comprising a rotor with a plurality of fan blades connected thereto for generating an axial airflow during operation of the fan, a sensor for detecting fan failure, and an airflow blocking device positioned at an exhaust side of the fan and configured to prevent airflow through the fan upon detection of the fan failure. The airflow blocking device is stowed in a position removed from a path of the axial airflow generated by the fan during operation of the fan.

The sensor may be configured to detect reduced rotation of the rotor and fan blades below a specified threshold, wherein operation of the fan comprises rotation of the rotor and fan blades above the specified threshold. In one or more embodiments, the sensor may detect a tachometer signal indicating a rotational speed of the rotor.

In one or more embodiments, the airflow blocking device is connected only to a stator of the fan.

In one or more embodiments, the airflow blocking device comprises a plurality of discs positioned in a collapsed position on a stator during operation of the fan and positioned in an open position substantially blocking airflow through the fan during fan failure.

In one or more embodiments, the airflow blocking device comprises a disc having a first diameter not exceeding a diameter of a stator during fan operation. The disc is expandable to a second diameter wherein the disc substantially blocks airflow through the fan during fan failure.

In one or more embodiments, the airflow blocking device comprises a cover slidable to substantially block airflow through the fan during fan failure.

In another embodiment, a method generally comprises generating at a fan, an axial airflow to cool electronics, detecting a failure at the fan, and deploying an airflow blocking device positioned at an exhaust side of the fan and configured to prevent airflow through the fan upon detection of the fan failure. The airflow blocking device is stowed in a position removed from a path of the axial airflow generated by the fan during operation of the fan.

In yet another embodiment, an apparatus generally comprises a fan tray receivable in a chassis for cooling electronic components, the fan tray comprising a plurality of fans, a controller for receiving input from sensors configured for detecting fan failure, and airflow blocking devices at each of the fans. Each of the airflow blocking devices stowed in a position removed from a path of axial airflow generated by a fan during operation of the fan and independently deployed to prevent airflow recirculation through the failed fan upon receiving input from the controller.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of modules (e.g., service cards, line cards, fabric cards, route processors, power supply units, fan trays, or other modules) installed in a chassis. In an air-cooled electronic system, cooling air is supplied to each of the modules to maintain a normal operating state of each module.

Equipment cooled with multiple fans is expected to operate with a single fan failure without any degradation in its performance. A failed fan puts severe limitations on system operating temperatures. In addition to the loss of cooling, a fan failure creates a significant amount of airflow recirculation, as the airflow through a failed fan follows a path of least impedance. This reduces the airflow through the electronics and creates cooling challenges. If there is insufficient heat transfer from the equipment, it may overheat and sustain thermal damage. In the case of a fan failure in an exhaust side fan tray, which pulls airflow through electronics, hot exhaust air from the failed fan recirculates back through active fans and increases the operating temperature of the fans, thereby reducing system reliability. Airflow recirculation from a failed fan significantly reduces the airflow through system electronics, which causes high power components to operate at much higher temperature, thus impacting system reliability. Fan failure may result in a need to reduce system operating temperature due to cooling limitations during fan failure, which leads to reduced system performance.

The embodiments described herein prevent air recirculation through a failed fan thereby improving system airflow and cooling efficiency of electronic equipment through cooling from remaining operating fans. As described in detail below, one or more embodiments provide an airflow blocking device positioned at an exhaust side of a fan operable to cool electronic components. The airflow blocking device is movable between a fan operating position in which the airflow blocking device is stowed away from a path of axial airflow generated by the fan in normal operation and a fan failed position in which airflow through the fan is substantially blocked to prevent airflow recirculation during fan failure.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise one or more fan trays each comprising any number of fans for cooling the electronic equipment and configured to prevent airflow recirculation during fan failure as described herein.

Figure 1B:
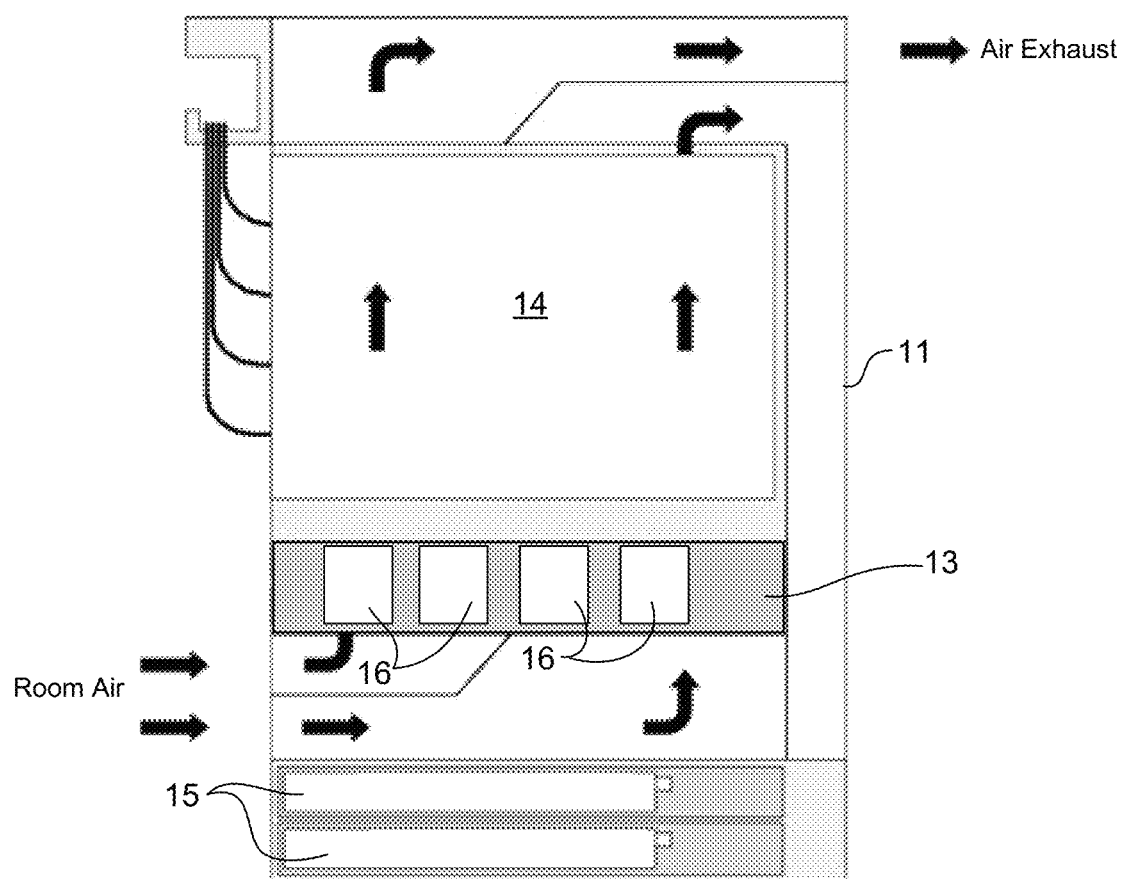
FIG. 1B is a plan view of another example of a chassis comprising a fan tray for cooling electronic equipment within the chassis.

Referring now to the drawings and first to FIGS. 1A and 1B, plan views illustrating examples of network device layouts are shown. Each network device comprises a chassis 10 (FIG. 1A), 11 (FIG. 1B) comprising one or more frames or structures configured for receiving and supporting various electronic components, including for example, power supplies, circuit boards, chips, optical modules, or other components. One or more components may be located on line cards, route processors, route switch processors, fabric cards, or other removable modules, indicated at 14 in FIGS. 1A and 1B. The modules 14 may be positioned vertically or horizontally within the chassis 10, 11. The chassis 10, 11 may also contain any number of power modules 15. The power modules 15 may be cooled by the fans 16 or include their own cooling components. Each chassis 10, 11 is configured for receiving one or more fan trays 12 (FIG. 1A), 13 (FIG. 1B), each comprising a plurality of fans 16 for cooling the electronic components. The term "chassis" as used herein refers to any structure or enclosure housing the electronic or optical components and fans.

Each fan tray 12, 13 may comprise any number of fans 16 operable to provide airflow through the chassis 10, 11 as shown by arrows indicating the direction of airflow in FIGS. 1A and 1B. Room air may enter, for example, along a side of the chassis 10, 11 and exit at an air exhaust (e.g., two air exhausts in FIG. 1A, one air exhaust in FIG. 1B). The configuration shown in FIG. 1A comprises two fan trays 12 positioned to provide airflow towards a front and rear of the chassis 10. The configuration shown in FIG. 1B comprises one fan tray 13 positioned to provide airflow towards a rear of the chassis 11. As described in detail below, each fan 16 comprises an airflow blocking device to prevent air recirculation through a failed fan, thereby improving system airflow and cooling efficiency of the electronic equipment by the remaining operational fans.

It is to be understood that the layouts shown in FIGS. 1A and 1B are only examples and the fans described herein may be used in other types of network devices comprising any number of fans or fan trays configured for use in various locations within the chassis for cooling electronic components within the chassis. The air intake and air exhaust may be positioned at any location (e.g., side, front, rear). The fans 16 may be positioned near the intake (as shown in FIGS. 1A and 1B) or near the exhaust to pull airflow through the electronics.

Figure 2:
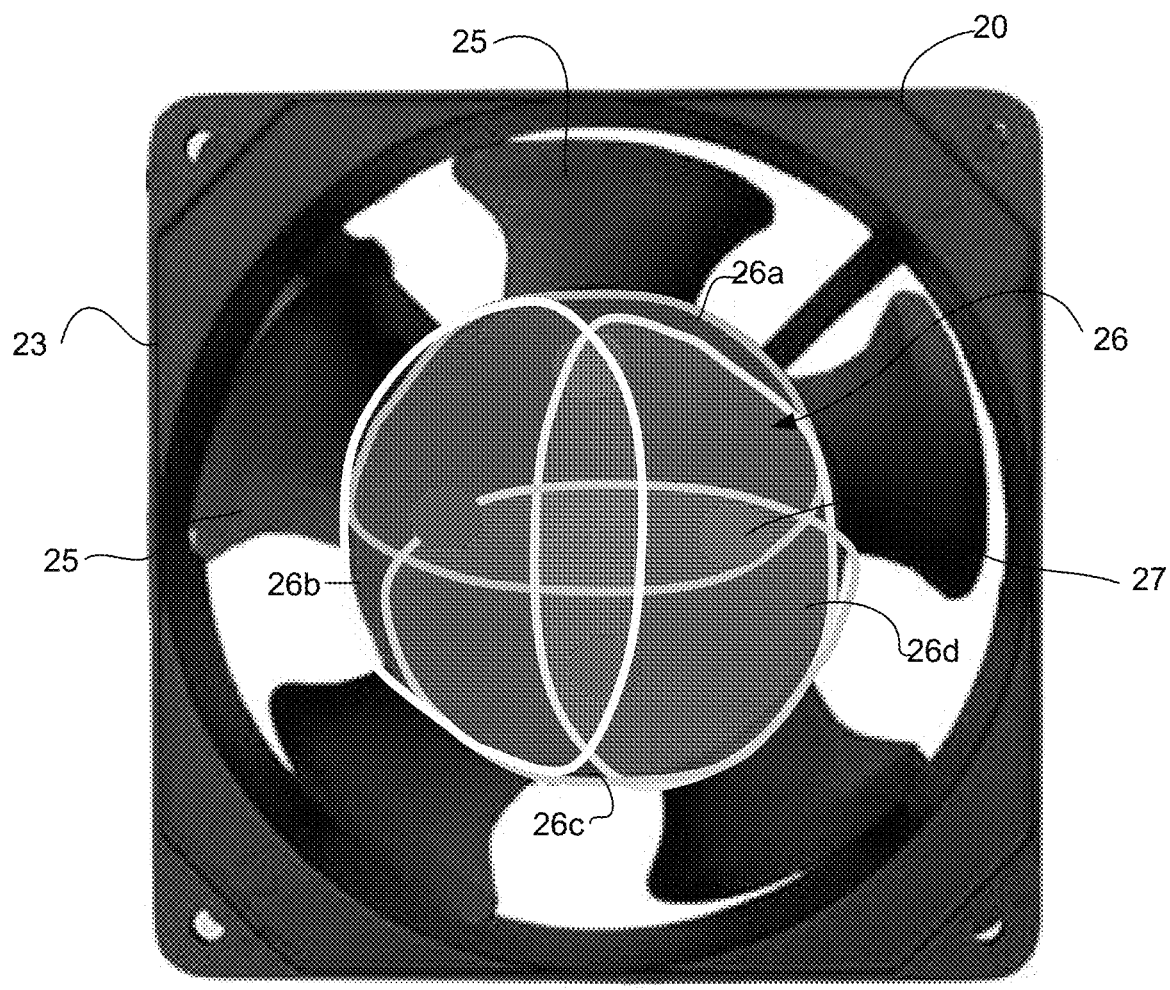
FIG. 2 is a rear view of a fan comprising airflow blocking discs in a collapsed position during normal fan operation, in accordance with one embodiment.

FIG. 2 is a rear view of a fan 20 comprising an airflow blocking device, generally indicated at 26, in accordance with one embodiment. The fan comprises a frame 23, blades 25 attached to a rotor, and a stator 24 (shown in FIG. 3) located on the exhaust side of the fan. In one or more embodiments, the airflow blocking device 26 is connected only to the stator 24. In the example shown in FIGS. 2 and 3, the airflow blocking device 26 comprises a plurality of discs 26a, 26b, 26c, 26d connected to the fixed stator of the axial fan and to fan electronics through electrical actuation devices 27 (e.g., servo motors). As described below, the motors 27 (or other actuators) receive input from a controller to deploy the discs 26a, 26b, 26c, 26d following a fan failure. FIG. 2 shows the discs 26a, 26c, 26c, 26d in a collapsed position during normal fan operation (e.g., power applied to fan and rotor rotation above a specified threshold) in which the airflow blocking device is removed from the path of axial airflow generated by the rotating blades 25. Since the airflow blocking device 26 is completely removed from the airflow path during normal fan operation, the airflow blocking device has no impact on cooling airflow through the fan or fan performance.

Figure 3:
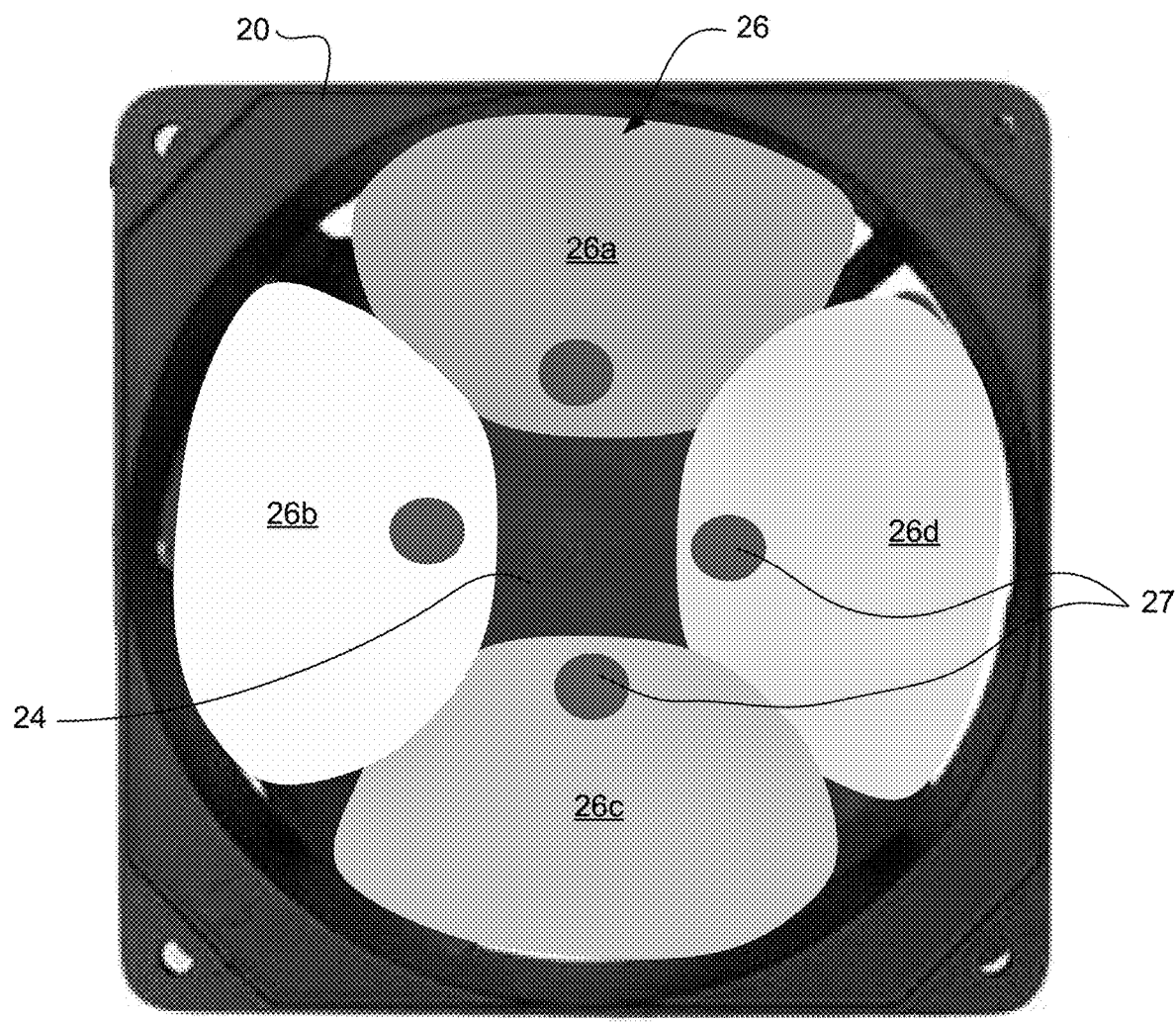
FIG. 3 is a rear view of the fan of FIG. 2 with the discs in an open position to prevent airflow recirculation during fan failure.
Figure 4A:
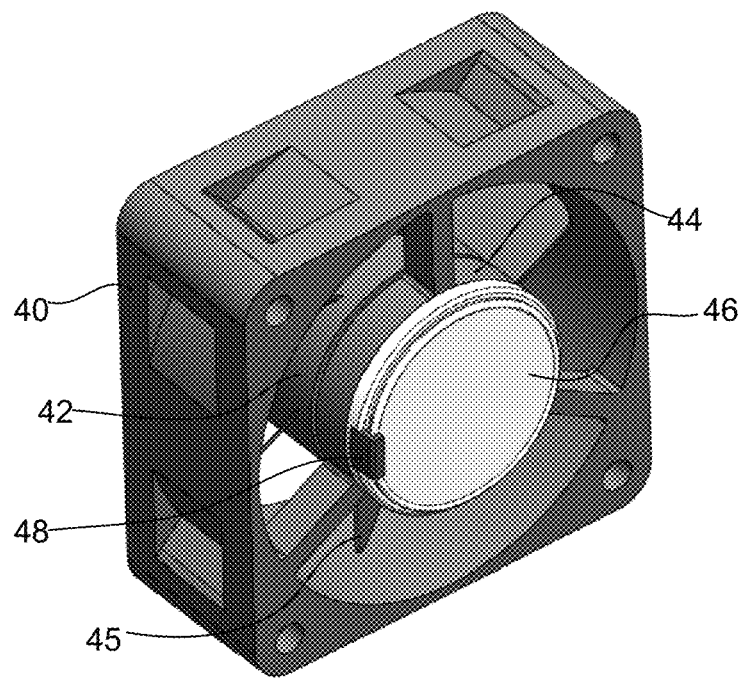
FIG. 4A is a perspective of a fan with an airflow blocking disc in a collapsed position during normal fan operation, in accordance with one embodiment.
Figure 4B:
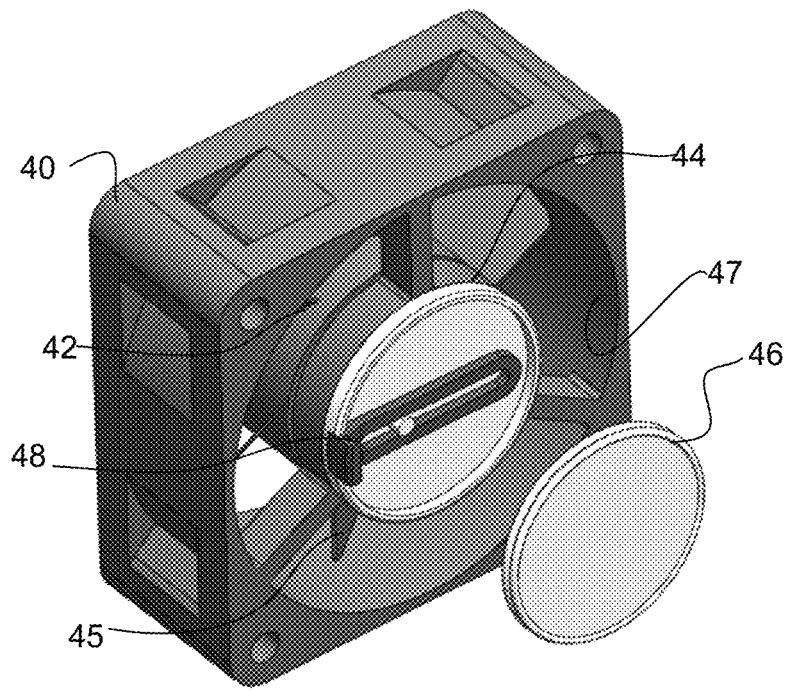
FIG. 4B is an exploded view of the fan and airflow blocking disc of FIG. 4A.

When a fan failure is detected (e.g., reduced RPM below the specified threshold with power applied to the fan), a controller sends a signal to open the discs 26a, 26b, 26c, 26d as shown in FIG. 3 to prevent airflow recirculation through the failed fan. The airflow blocking device 26 operates as a screen to substantially prevent airflow recirculation during fan failure. As described below, various mechanical arrangements may be used to receive input from a control circuit and open the discs to the position shown in FIG. 3 (fan failure mode).

In the example shown in FIGS. 2 and 3, the discs are attached to the fixed stator 24 located on the exhaust side of the axial fan. In one or more embodiments, the discs are assembled through a rotating shaft 27 (e.g., miniaturized servomotor embedded with fan electronics). In normal fan operation, the discs remain collapsed over the body of the stator 24 (FIG. 2). Once a signal is received indicating fan failure (e.g., tach signal falls below a specified threshold indicating reduced RPM), the discs 26a, 26b, 26c, 26d rotate and cover the open flow area (airflow path) of the fan to operate as an exhaust screen and prevent airflow bypass through the fan.

The material, weight, shape, profile, rotation opening direction (clockwise or counterclockwise), or number of discs may be optimized to provide maximum coverage of the flow area. In one or more embodiments, the discs 26a, 26b, 26c, 26d may be interconnected with flexible material (not shown) to cover open gaps therebetween.

Figure 5A:
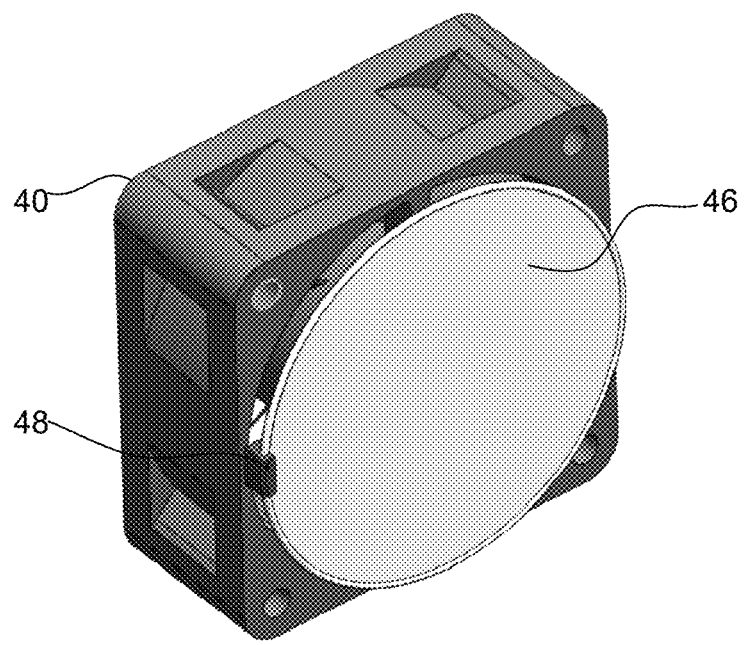
FIG. 5A is a perspective of the fan of FIG. 4A with the airflow blocking disc in an open position to prevent airflow recirculation during fan failure.
Figure 5B:
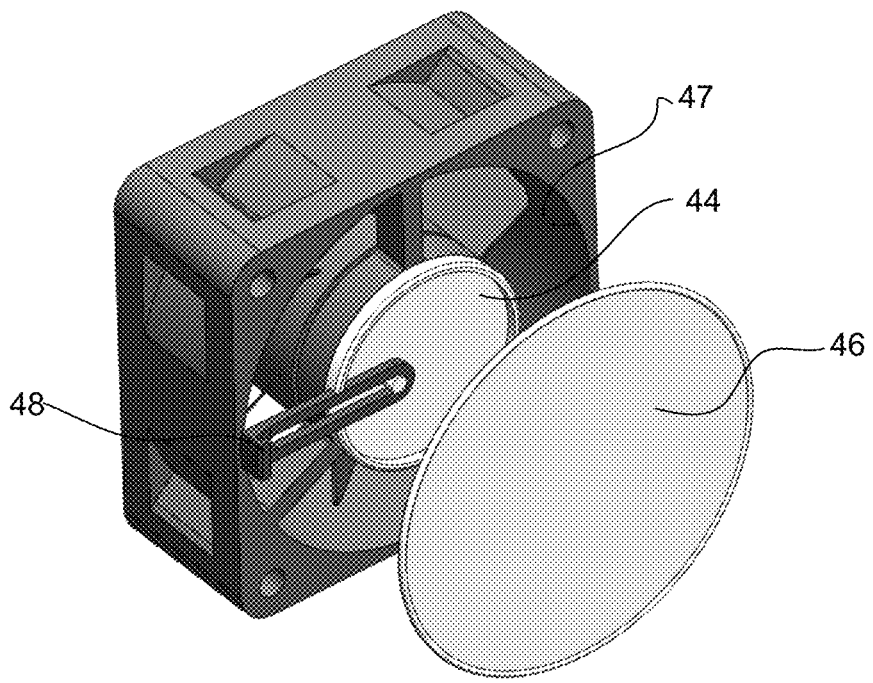
FIG. 5B is an exploded view of the fan and airflow blocking disc of FIG. 5A.

FIGS. 4A-5B illustrate another example of an airflow blocking device 46, in accordance with one embodiment. The device 46 is installed on a fan comprising a frame 40, rotor 42, and stator 44. As previously described, blades 45 are connected to the rotor 42 for rotation therewith to generate airflow along an axial path through the fan. The airflow blocking device 46 may comprise a circular spring-steel wire ringed disc formed of fabric, Mylar, or any other suitable material that can be folded over on itself (e.g., in a figure eight manner) to have a first diameter. The disc 46 is stowed in a space generally corresponding to (or not exceeding) a diameter of the stator 44 (FIGS. 4A and 4B) and deployable to a second diameter generally corresponding to an axial opening 47 within the fan frame 40 (FIGS. 5A and 5B). In one example, the disc 46 is held in its stowed position by a spring loaded slide 48 that, when released, extends radially and allows the disc 46 to unfold elastically to its full deployed diameter (biased position). The material of the disc 46 may be held against the fan body by air pressure, thereby substantially sealing the fan aperture 47. The slider 48 may be activated electrically using a nichrome trigger wire that breaks when heated or an SMA (Shape Memory Alloy) filament that contracts when heated, or any other suitable device.

Figure 6A:
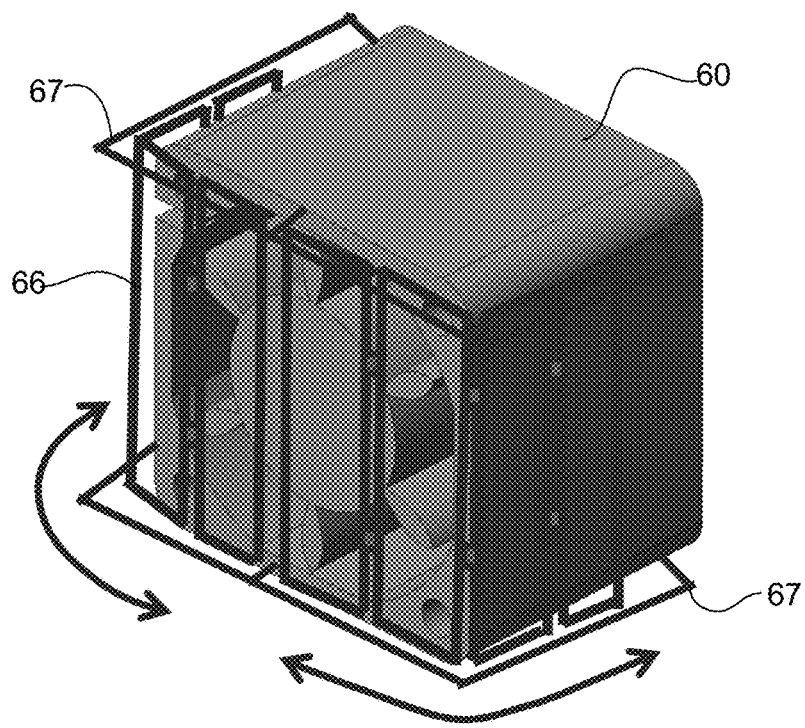
FIG. 6A is a perspective of a fan with an airflow blocking sliding cover shown in a closed position during fan failure.
Figure 6B:
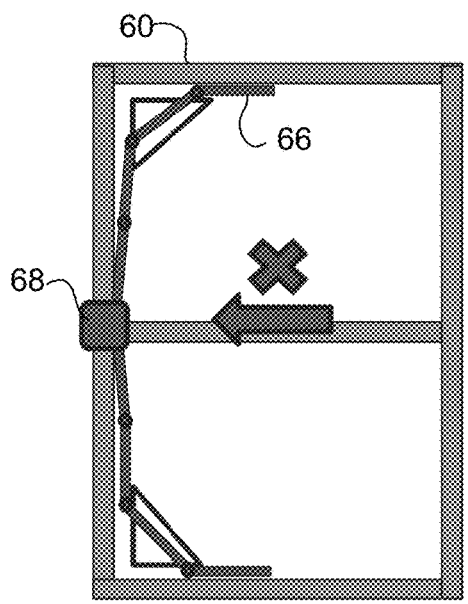
FIG. 6B is a top view of the fan and airflow blocking sliding cover shown in FIG. 6A.
Figure 6C:
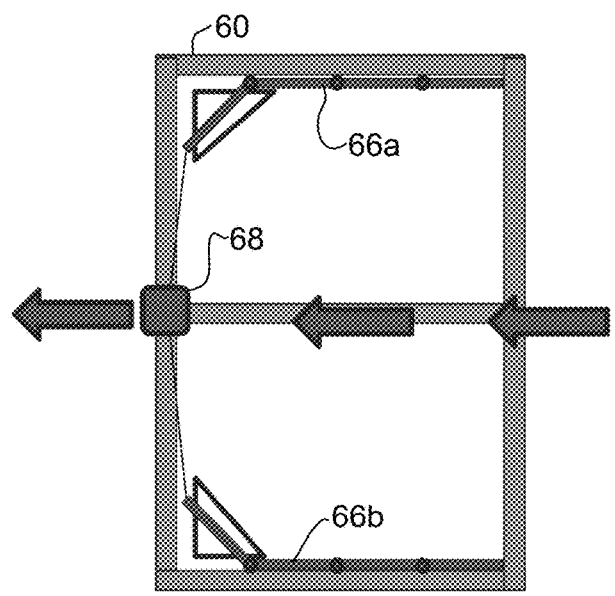
FIG. 6C is a top view of the fan of FIG. 6A with the airflow blocking sliding cover in an open position during normal fan operation.

FIG. 6A is a perspective of a fan 60 with an airflow blocking device 66 comprising a sliding cover that substantially prevents recirculation airflow through the fan during fan failure. A top view of the fan 60 and sliding cover 66 is shown in FIG. 6B with the cover in its airflow blocking position. The cover 66 may comprise a sliding cover that retracts in a position adjacent to one side of the fan frame or two sliding pieces 66a, 66b (FIG. 6C) that are stowed on opposite sides of the fan during normal fan operation. As shown in the top view of FIG. 6C, during normal fan operation, the siding covers 66a, 66b are removed from the airflow path and positioned on opposite sides of the fan 60 to allow airflow through the axial airflow path as indicated by arrows in FIG. 6C. The sliding cover may be formed from plastic or other suitable light weight, high temperature resistant material. In the example shown in FIG. 6A, a track 67 is provided on which the cover 66 slidably engages. The cover 66 may be controlled by any suitable control components 68 (e.g., located on a top portion of the fan frame as shown in FIGS. 6B and 6C). The sliding cover 66 or covers 66a, 66b, track (rail) 67, and control components 68 are removed from the axial airflow path during normal fan operation and thus do not impact fan performance. The sliding cover 66 may also be connected to the fan tray rather than the fan frame.

Various control circuits may be used to control deployment of the airflow blocking device 26, 46, 66. For example, control circuits may provide input to a spring structure, locking pin, or both a spring structure and locking pin. The spring structure may comprise, for example, a tensile spring, mechanical spring reel, shape memory allow spring (e.g., nitinol shape memory spring), or other suitable mechanical structure operable to deploy the airflow blocking device upon detection of a fan failure. The locking pin may comprise, for example, one or more micro linear actuator, solenoid, linear servo motor, or other suitable locking device that may be used to release the airflow blocking device from its stowed position upon detection of fan failure.

It is to be understood that the mechanical control components described above are only examples and other arrangements, types, or number of components may be used without departing from the scope of the embodiments.

Figure 7:
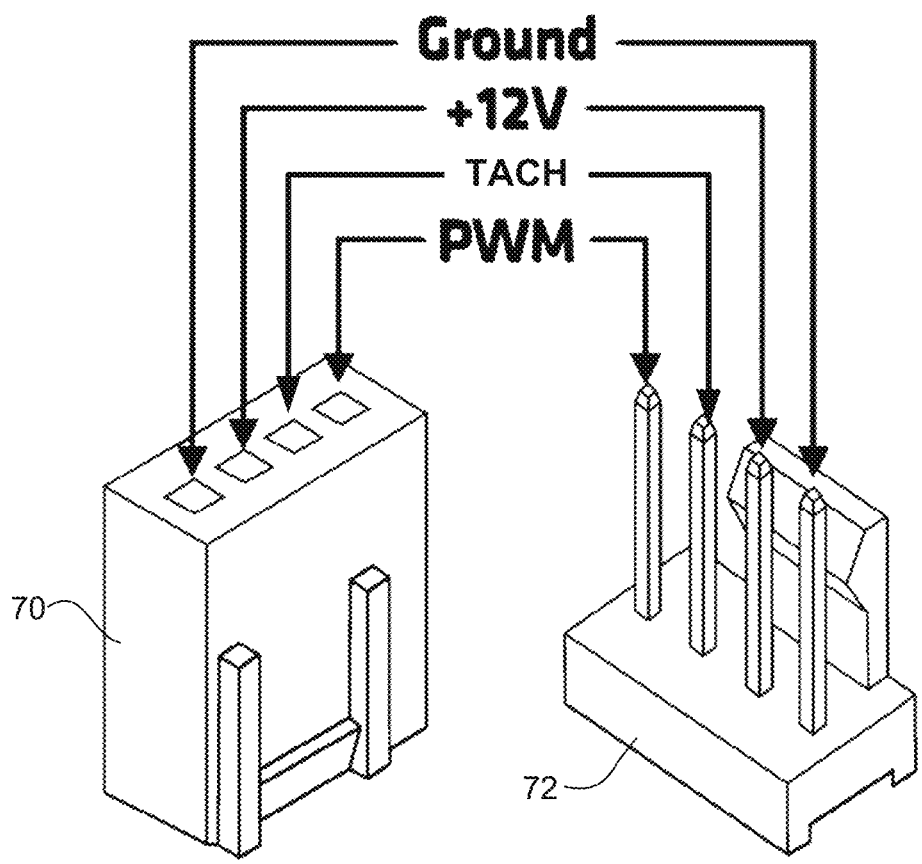
FIG. 7 illustrates an electrical fan connector for a PWM (Pulse Width Modulation) controlled fan.

FIG. 7 illustrates an example of a PWM four-pin fan connector, in accordance with one embodiment. The connector includes two mating components 70, 72. The connections include a ground connection, power connection (e.g., 12 volts), tach (tachometer) connection that provides a readout of the current fan speed, and a PWM connection that controls the fan by providing impulse power. A signal is sent via the tach wire with a certain frequency that is proportional to the fan speed expressed in RPM (revolutions per minute). As described below, this tach signal may be used to identify a failed fan.

In one or more embodiments, a failed fan condition is detected by monitoring the tach signal. A tach sensor senses fan revolutions and may trigger a signal when fan speed falls below a specified threshold (e.g., user defined, programmable threshold). Fan speed falling below the specified threshold may indicate wearing of the fan (e.g., imminent failure) or a stuck rotor (due to failure or debris). Parameters other than fan speed may also be used to indicate fan failure. For example, a temperature sensor located within the airflow path may be used to identify an increase in temperature, which may indicate a fan failure or impending failure. The sensor may provide input directly to the airflow blocking device to initiate deployment of the device and prevent airflow recirculation at the failed fan. One or more sensors may also provide input to a controller in communication with fan electronics to signal deployment of the airflow blocking device. For example, sensors may be installed in a fan tray and provide input to the controller to indicate reduced rotation of one of the fan rotors. The controller may then determine if the reduced rotation is due to a loss of power input, PWM signal, or fan failure and signal the fan to take appropriate action, as described below.

Figure 8:
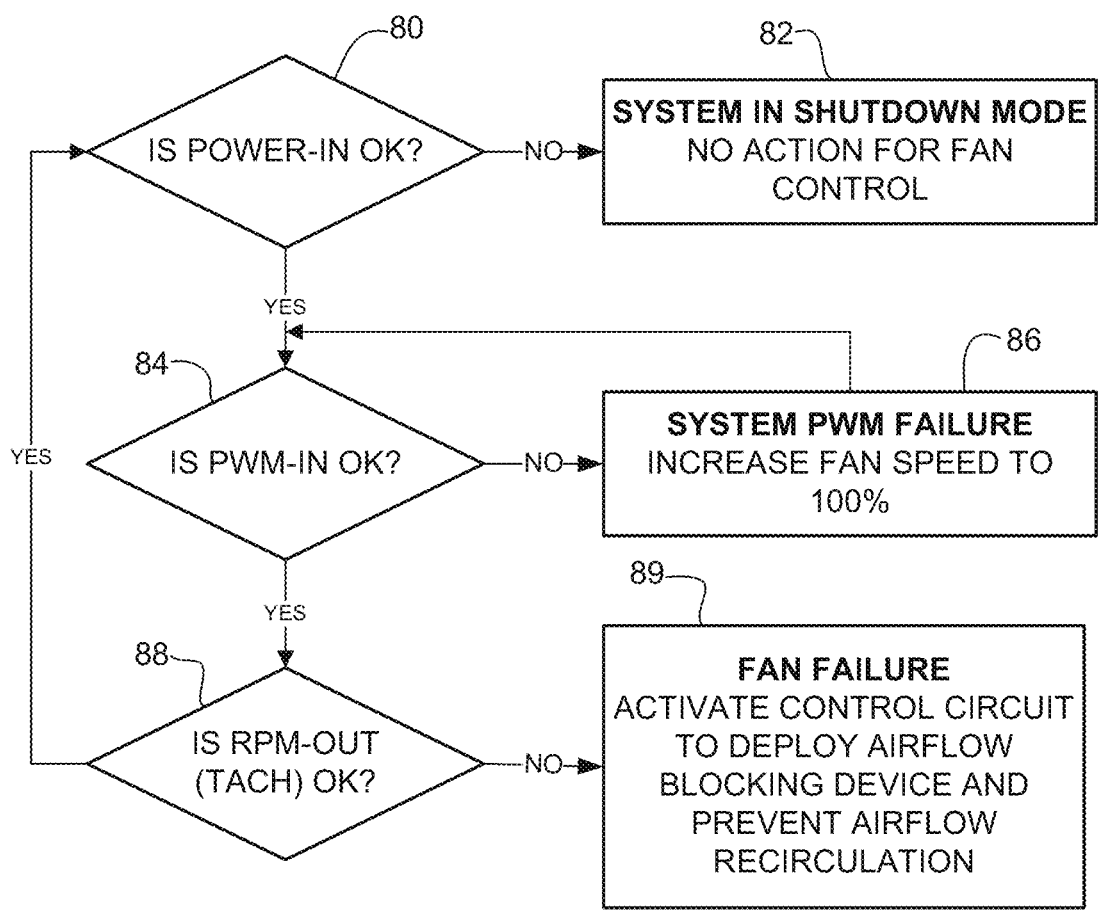
FIG. 8 is a flowchart illustrating an overview of a process for preventing airflow recirculation during fan failure, in accordance with one embodiment.

FIG. 8 is a flowchart illustrating an overview of a process for preventing airflow recirculation during fan failure, in accordance with one embodiment. At step 80, the control system checks if power is on. If the system is turned off (e.g., in shutdown mode) no action is needed for fan control (step 82). The airflow blocking device remains in its stowed position. If the power is on, a PWM check is made (step 84). If a PWM failure is detected, the fan speed is preferably increased to 100% (step 86). The system may repeat the PWM check at a specified interval (e.g., every five minutes) to see if the system recovers, in which case normal fan operation may resume. If the PWM is operating correctly, a tach signal check is made to determine if fan RPM is above a threshold level (e.g., above zero RPM or other minimum rotational speed) (step 88). If the tach signal indicates a fan failure (e.g., RPM below a specified threshold or zero), a control circuit for the airflow blocking device is activated to block the airflow path, thereby preventing airflow recirculation through the fan (step 89). If the tach signal indicates normal fan operation, the system may repeat all three checks at specified intervals (e.g., every five minutes resume check starting at step 80).

It is to be understood that the process shown in FIG. 8 and described above is only an example and that steps may be added, combined, removed, or modified, without departing from the scope of the embodiments. Also, the time intervals noted above for repeating system checks is only an example and any appropriate interval may be used. As previously described, use of the tach signal to indicate fan failure is only one example and other sensors may be used to provide an indication of fan failure. For example, a temperature sensor at the fan exhaust may be used to sense a temperature increase indicating fan failure.

Figure 9:
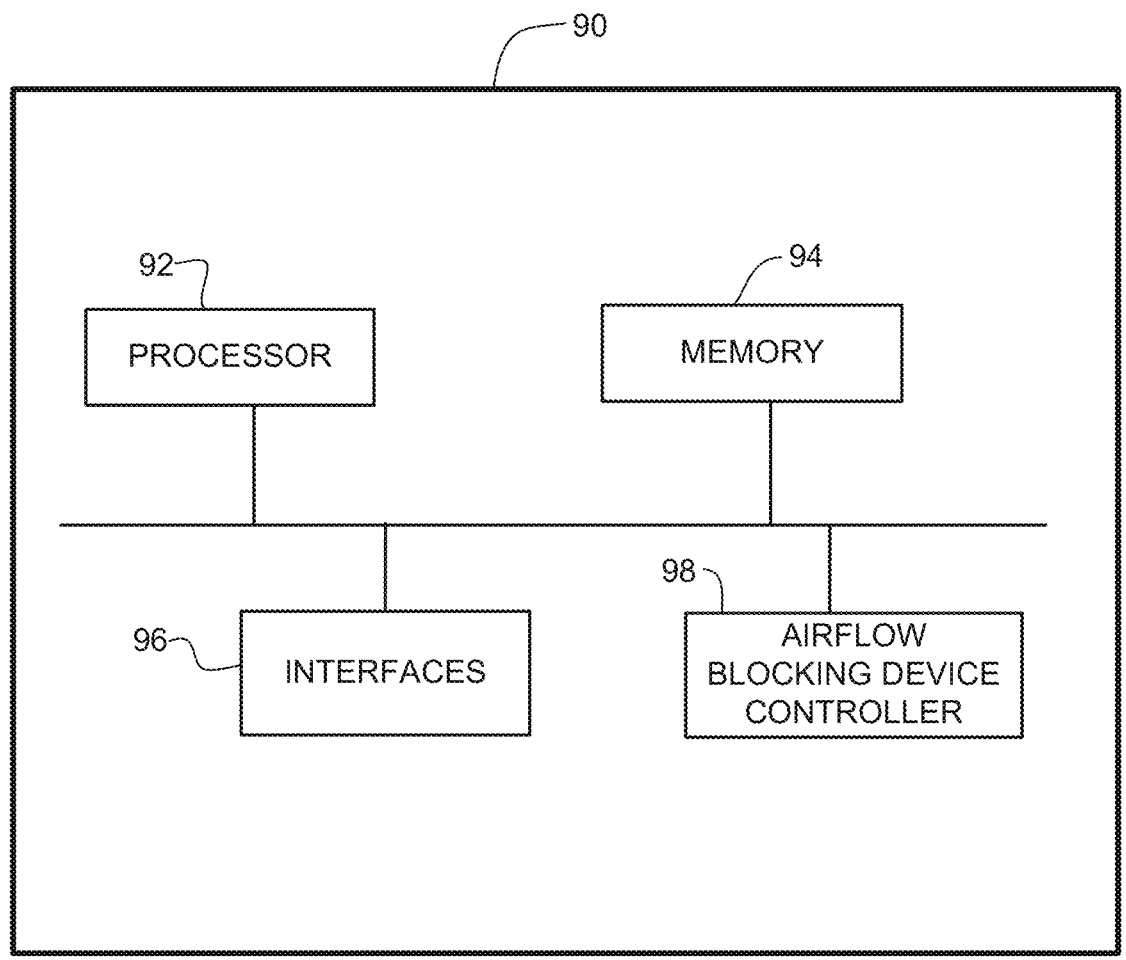
FIG. 9 is a block diagram depicting an example of a network device that may be used to implement the embodiments described herein.

FIG. 9 illustrates an example of a network device 90 that may be used to implement the embodiments described herein. In one embodiment, the network device 90 is a programmable machine that may be implemented in hardware, software, or any combination thereof. The network device 90 includes one or more processor 92, memory 94, network interfaces 96, and airflow blocking device controller 98.

Memory 94 may be a volatile memory or non-volatile storage, which stores various applications, operating systems, modules, and data for execution and use by the processor 92. For example, components of the controller 98 (e.g., code, logic, software, firmware, etc.) may be stored in the memory 94. The network device 90 may include any number of memory components.

Logic may be encoded in one or more tangible media for execution by the processor 92. For example, the processor 92 may execute codes stored in a computer-readable medium such as memory 94. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 92 may be operable to perform one or more steps shown in the flowchart of FIG. 8, for example. The network device 90 may include any number of processors 92.

The controller 98 may comprise one or more components (software, code, logic) and control circuit (electrical and mechanical components) operable to monitor operation (e.g., tach signal, operating temperature, or other parameter) and deploy the stowed airflow blocking device 26, 46, 66 (FIGS. 3, 5A, 6A, and 9). The controller 98 may comprise a sensor operable to detect failure of the fan and logic (e.g., processor, software) that interacts with the sensor and the fan to control the airflow blocking device in response to fan failure detection.

The network interfaces 96 may comprise any number of interfaces (connectors, line cards, ports) for receiving data or transmitting data to other devices. The network interface 96 may include, for example, an Ethernet or optical interface located on one of the modules 14 (FIG. 1) for connection to a computer or network.

It is to be understood that the network device 90 shown in FIG. 9 and described above is only an example and that different configurations of network devices may be used. For example, the network device 90 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
a fan for cooling electronics within a chassis, the fan comprising:
a rotor with a plurality of fan blades connected thereto for generating an axial airflow during operation of the fan;
a sensor for detecting failure of the fan; and
an airflow blocking device positioned at an exhaust side of the fan and configured to prevent airflow through the fan upon detection of said fan failure, wherein the airflow blocking device is stowed in a position removed from said axial airflow generated by the fan during said operation of the fan;
wherein the airflow blocking device expands radially outwardly from a central stowed position upon said detection of said fan failure.

2. The apparatus of claim 1 wherein the sensor is configured to detect reduced rotation of the rotor and the fan blades below a specified threshold, wherein said operation of the fan comprises rotation of the rotor and the fan blades above said specified threshold.

3. The apparatus of claim 1 wherein the sensor detects a tachometer signal indicating a rotational speed of the rotor.

4. The apparatus of claim 1 wherein the airflow blocking device comprises a plurality of discs positioned in a collapsed position on a central portion of a stator during said fan operation and positioned in an open position substantially blocking said airflow through the fan during said fan failure.

5. The apparatus of claim 1 wherein the airflow blocking device comprises a disc having a first diameter not exceeding a diameter of a stator during said fan operation and wherein the disc is expandable to a second diameter wherein the disc substantially blocks said airflow through the fan during said fan failure.

6. The apparatus of claim 1 wherein the airflow blocking device is attached to a stator of the fan.

7. An apparatus comprising:
a fan for cooling electronics within a chassis, the fan comprising:
a rotor with a plurality of fan blades connected thereto for generating an axial airflow during operation of the fan;
a sensor for detecting failure of the fan; and
an airflow blocking device positioned at an exhaust side of the fan and configured to prevent airflow through the fan upon detection of said fan failure, wherein the airflow blocking device is stowed in a position removed from said axial airflow generated by the fan during said operation of the fan;
wherein the airflow blocking device comprises a cover slidable to substantially block said airflow through the fan during said fan failure.

8. The apparatus of claim 7 wherein the sensor is configured to detect reduced rotation of the rotor and the fan blades below a specified threshold, wherein said operation of the fan comprises rotation of the rotor and the fan blades above said specified threshold.

9. The apparatus of claim 7 wherein the sensor detects a tachometer signal indicating a rotational speed of the rotor.

10. A method comprising:
generating at a fan, an axial airflow to cool electronics;
detecting a failure at the fan; and
deploying an airflow blocking device positioned at an exhaust side of the fan and configured to prevent airflow through the fan upon detection of said fan failure, wherein the airflow blocking device is stowed in a position removed from said axial airflow generated by the fan during operation of the fan;
wherein the airflow blocking device is attached to a stator of the fan and expands radially outwardly from a central stowed position upon said detection of said fan failure.

11. The method of claim 10 wherein detecting said fan failure comprises detecting reduced rotation of a rotor below a specified threshold, wherein said operation of the fan comprises rotation of the rotor above said specified threshold.

12. The method of claim 10 further comprising monitoring a tachometer signal indicating a rotational speed of the fan and wherein detecting said fan failure comprises detecting said fan failure based on said tachometer signal.

13. The method of claim 10 wherein the airflow blocking device comprises a plurality of discs positioned in a collapsed position on a central portion of the stator during said fan operation and positioned in an open position substantially blocking said airflow through the fan during said fan failure.

14. The method of claim 10 wherein the airflow blocking device comprises a disc having a first diameter not exceeding a diameter of the stator during said fan operation and wherein the disc is expandable to a second diameter wherein the disc substantially blocks said airflow through the fan during said fan failure.

15. An apparatus comprising:
a fan tray receivable in a chassis for cooling electronic components, the fan tray comprising a plurality of fans;
a controller for receiving input from sensors configured for detecting fan failure; and
airflow blocking devices at each of said plurality of fans, wherein each of the airflow blocking devices is stowed in a position removed from axial airflow generated by a fan during operation of the fan and independently deployed to prevent airflow recirculation through a failed fan upon receiving input from the controller;
wherein each of the airflow blocking devices comprises a cover slidable to substantially block said airflow recirculation through the fan during said fan failure.

16. The apparatus of claim 15 wherein each of the sensors is configured to detect reduced rotation of the fan below a specified threshold.

17. The apparatus of claim 15 wherein each of the sensors is configured to detect a tachometer signal indicating a rotational speed of the fan.

* * * * *